(12) United States Patent
Seo et al.

(10) Patent No.: US 10,944,069 B2
(45) Date of Patent: Mar. 9, 2021

(54) ORGANIC ELECTROLUMINESCENCE DEVICE, METHOD FOR MANUFACTURING THE SAME, AND DISPLAY DEVICE INCLUDING THE SAME

(71) Applicant: SAMSUNG DISPLAY CO., LTD., Yongin-si (KR)

(72) Inventors: Dongkyu Seo, Suwon-si (KR); Dongchan Kim, Gunpo-si (KR); Jiyoung Moon, Gwangju-si (KR); Yeongrong Park, Osan-si (KR); Myungchul Yeo, Asan-si (KR); Jihye Lee, Incheon (KR); Hyungseok Jang, Hwaseong-si (KR); Wonjong Kim, Suwon-si (KR); Yoonhyeung Cho, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/167,848

(22) Filed: Oct. 23, 2018

(65) Prior Publication Data
US 2019/0198797 A1    Jun. 27, 2019

(30) Foreign Application Priority Data

Dec. 21, 2017    (KR) .................. 10-2017-0177437

(51) Int. Cl.
*H01L 51/52*    (2006.01)
*H01L 51/50*    (2006.01)
(Continued)

(52) U.S. Cl.
CPC ....... *H01L 51/5203* (2013.01); *G09G 3/3258* (2013.01); *H01L 27/1214* (2013.01); *H01L 51/5072* (2013.01); *H01L 51/5092* (2013.01)

(58) Field of Classification Search
CPC ............ H01L 51/5072; H01L 51/5076; H01L 51/508
See application file for complete search history.

(56) References Cited

U.S. PATENT DOCUMENTS 7,528,003 B2    5/2009    Liu
8,080,937 B2    12/2011    Rajan et al.
(Continued)

FOREIGN PATENT DOCUMENTS

JP    6099036 B2    3/2017
KR    10-0879477 B1    1/2009
(Continued)

OTHER PUBLICATIONS

Yang et al., "Organic Light Emitting Diode Using Inorganic Material as Electron Transport Layer", Chinese Physics Letters (1997), vol. 14, No. 12, 946-948.
(Continued)

*Primary Examiner* — Cuong Q Nguyen
*Assistant Examiner* — Peter M Albrecht
(74) *Attorney, Agent, or Firm* — Lewis Roca Rothgerber Christie LLP

(57) ABSTRACT

An organic electroluminescence device includes a first electrode, a hole transport region on the first electrode, a light emitting layer on the hole transport region, an electron transport region on the light emitting layer, and a second electrode on the electron transport region. The electron transport region includes an electron transport layer directly on the light emitting layer. The electron transport layer includes a first ternary compound including a halogen element.

9 Claims, 7 Drawing Sheets

(51) Int. Cl.
    *G09G 3/3258*    (2016.01)
    *H01L 27/12*     (2006.01)

(56) References Cited

U.S. PATENT DOCUMENTS

| | | | |
|---|---|---|---|
| 8,916,274 | B2 | 12/2014 | Lee et al. |
| 9,905,791 | B2 | 2/2018 | Kim et al. |
| 2010/0252821 | A1* | 10/2010 | Park ................. C09K 11/06 257/40 |
| 2016/0248034 | A1* | 8/2016 | Kim ................. H01L 51/5084 |
| 2016/0372714 | A1* | 12/2016 | Kim ................. H01L 27/3262 |
| 2017/0033170 | A1* | 2/2017 | Kim ................. H01L 51/5275 |
| 2017/0152608 | A1* | 6/2017 | Jin ................. C30B 7/14 |
| 2018/0233688 | A1* | 8/2018 | Chen ................. H01L 51/50 |

FOREIGN PATENT DOCUMENTS

| | | |
|---|---|---|
| KR | 10-2016-0103596 A | 9/2016 |
| KR | 10-2017-0000053 A | 1/2017 |

OTHER PUBLICATIONS

Feng et al., "Organometal halide perovskite as hole injection enhancer in organic light-emitting diode", Organic Electronics (2017), 51, 257-263.

* cited by examiner

ORGANIC ELECTROLUMINESCENCE DEVICE, METHOD FOR MANUFACTURING THE SAME, AND DISPLAY DEVICE INCLUDING THE SAME

CROSS-REFERENCE TO RELATED APPLICATION

Korean Patent Application No. 10-2017-0177437, filed on Dec. 21, 2017, in the Korean Intellectual Property Office, and entitled: "Organic Electroluminescence Device, Method for Manufacturing the Same, and Display Device Including the Same," is incorporated by reference herein in its entirety.

BACKGROUND

1. Field

Embodiments relate to an organic electroluminescence device, a method for manufacturing the same, and an organic electroluminescence display device including the same, and more particularly, to an organic electroluminescence device including an electron transport layer composed of an inorganic material, a method for manufacturing the same, and an organic electroluminescence display device including the same.

2. Description of the Related Art

As an image display device, an organic electroluminescence display device has been actively developed. An organic electroluminescence display device is different from a liquid crystal display device and the like in that it is a so-called self-luminescence display device that realizes display by recombining holes and electrons injected from a first electrode and a second electrode in a light emitting layer to emit a light emitting material which is an organic compound included in the light emitting layer.

Furthermore, an organic electroluminescence device is not limited to the configuration described above, and various modifications thereof may be made.

SUMMARY

Embodiments are directed to an organic electroluminescence device including a first electrode, a hole transport region on the first electrode, a light emitting layer on the hole transport region, an electron transport region on the light emitting layer, and a second electrode on the electron transport region. The electron transport region includes an electron transport layer directly on the light emitting layer. The electron transport layer includes a first ternary compound including a halogen element.

The electron transport region may be composed of only an inorganic material.

The first ternary compound may be represented by Formula 1 below:

[Formula 1]

$X_n Y_m Z_q$ wherein, in Formula 1, X and Y are each independently an alkali metal, an alkaline earth metal, or a lanthanide metal; Z is a halogen element; and n, m, and q are each independently an integer of 1 to 5.

The first ternary compound may be at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, or $LiMgI_3$.

The organic electroluminescence device may further include an electron injection layer directly on the electron transport layer and contacting the second electrode. The electron injection layer may include an inorganic material.

The electron injection layer may include a second ternary compound, wherein the first ternary compound and the second ternary compound are the same or different.

The electron injection layer may include at least one of LiF, lithium quinolate (Liq), $Li_2O$, BaO, NaCl, CsF, or a lanthanide metal.

Embodiments are also directed to a method for manufacturing an organic electroluminescence device, the method including forming a first electrode, forming a hole transport region on the first electrode, forming a light emitting layer on the hole transport region, forming an electron transport region on the light emitting layer, and forming a second electrode on the electron transport region. Forming the electron transport region includes forming an electron transport layer to be directly disposed on the light emitting layer. Forming the electron transport layer is performed by co-depositing a first component, the first component being a halide of any one of an alkali metal, an alkaline earth metal, or a lanthanide metal, and a second component, the second component being any one of an alkali metal, and alkaline earth metal, or, a lanthanide metal.

The volume ratio of the first component to the second component may be 1:9 to 9:1.

The first component may be potassium iodide (KI), potassium chloride (KCl), lithium chloride (LiCl), sodium chloride (NaCl), rubidium chloride (RbCl), cesium chloride (CsCl), potassium bromide (KBr), rubidium bromide (RbBr), cesium bromide (CsBr), rubidium iodide (RbI), sodium iodide (NaI), lithium iodide (LiI) or cesium iodide (CsI).

The second component may be ytterbium (Yb), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu), beryllium (Be), magnesium (Mg), calcium (Ca), strontium (Sr), barium (Ba), or radium (Ra).

Forming the electron transport region may further include forming an electron injection layer to be directly disposed on the electron transport layer. Forming the second electrode may include forming the second electrode to be directly provided on the electron injection layer. Forming the electron injection layer may include depositing an inorganic material.

Forming the electron injection layer may include co-depositing the first component and the second component. A volume ratio of the first component to the second component in forming the electron injection layer may be either the same as or different from a volume ratio in the forming of an electron transport layer.

Forming the electron injection layer may include depositing at least one of LiF, lithium quinolate (Liq), $Li_2O$, BaO, NaCl, CsF, or a lanthanide metal.

Embodiments are also directed to an organic electroluminescence display device, including a base substrate, a thin film transistor on the base substrate, and an organic electroluminescence device connected to the thin film transistor. The organic electroluminescence device includes a first electrode, a hole transport region on the first electrode, a light emitting layer on the hole transport region, an electron transport region on the light emitting layer, and a second electrode on the electron transport region. The electron transport region includes an electron transport layer directly on the light emitting layer. The electron transport layer includes a first ternary compound including a halogen element.

The electron transport region may be composed of only an inorganic material.

The first ternary compound may be represented by Formula 1 below:

$$X_n Y_m Z_q, \quad \text{[Formula 1]}$$

wherein, in Formula 1, X and Y are each independently an alkali metal, an alkaline earth metal, or a lanthanide metal; Z is a halogen element; and n, m, and q are each independently an integer of 1 to 5.

The first ternary compound may be at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, and $LiMgI_3$.

The organic electroluminescence display device may further include an electron injection layer directly on the electron transport layer and contacting the second electrode, wherein the electron injection layer includes an inorganic material.

The electron injection layer may include at least one of LiF, lithium quinolate (Liq), $Li_2O$, BaO, NaCl, CsF, a lanthanide metal, or a second ternary compound. The first ternary compound and the second ternary compound are either the same or different.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
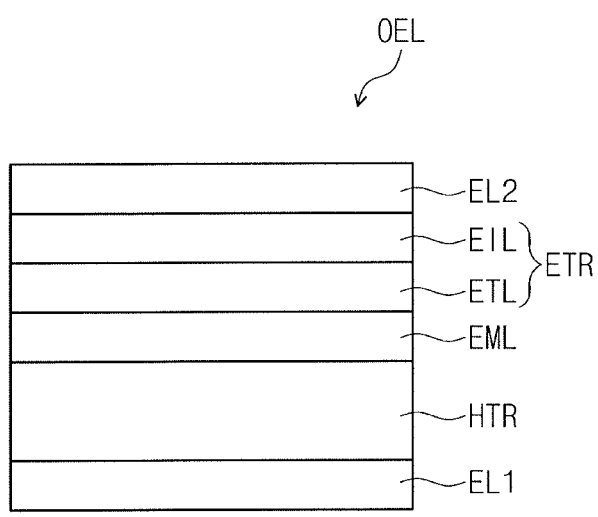
FIG. 1 illustrates a cross-sectional view of an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In describing each the drawing, similar reference numerals were used for similar elements. Also, in the accompanying drawings figures, the dimensions of structures are layers and regions may be exaggerated for the clarity of the inventive concept. It will be understood that, although the terms first, second, etc. may be used herein to describe various elements, these elements should not be limited by the terms. These terms are used only to distinguish one element from another. For example, a first element could be termed a second element, and similarly, a second element could be termed a first element without departing from the scope of the inventive concept. Terms of a singular form may include terms of a plural form unless the context clearly indicates otherwise.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
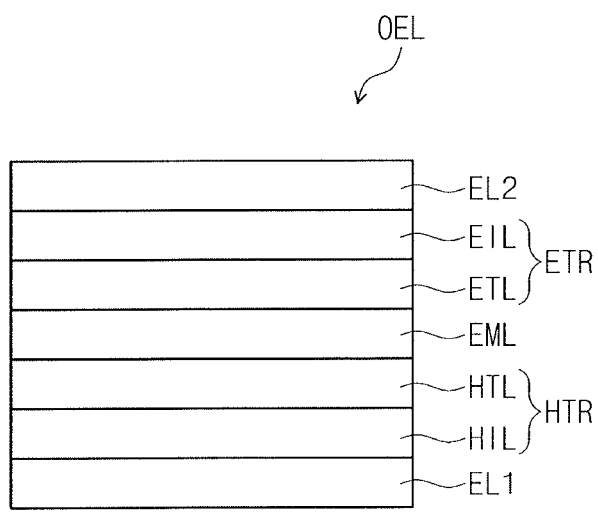
FIG. 2 illustrates a cross-sectional view of an organic electroluminescence device according to an embodiment.
Figure 3:
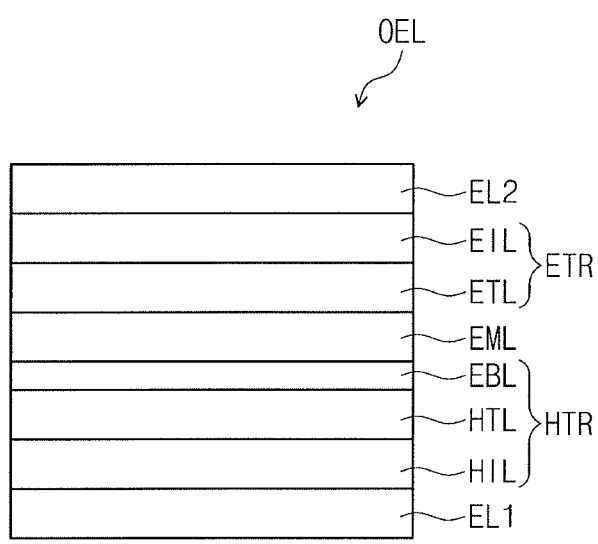
FIG. 3 illustrates a cross-sectional view of an organic electroluminescence device according to an embodiment.

FIG. 1 illustrates a cross-sectional view of an organic electroluminescence device according to an embodiment. FIG. 2 illustrates a cross-sectional view of an organic electroluminescence device according to an embodiment. FIG. 3 illustrates a cross-sectional view of an organic electroluminescence device according to an embodiment.

Referring to FIGS. 1 to 3, an organic electroluminescence device OEL according to an embodiment may include a first electrode EL1, a hole transport region HTR disposed on the first electrode EL1, a light emitting layer EML disposed on the hole transport region HTR, an electron transport region ETR disposed on the light emitting layer EML, and a second electrode EL2 disposed on the electron transport region ETR.

The first electrode EL1 may have conductivity. The first electrode EL1 may be a pixel electrode or a positive electrode. The first electrode EL1 may be a transmissive electrode, a transflective electrode, or a reflective electrode. When the first electrode EL1 is a transmissive electrode, the first electrode EL1 may include a transparent metal oxide, such as, for example, indium tin oxide (ITO), indium zinc oxide (IZO), zinc oxide (ZnO), indium tin zinc oxide (ITZO), or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg), or the first electrode EL1 may be in a form of a multilayer structure including a reflective film or a transflective film, both composed of the above materials, and a transparent conductive film composed of indium tin oxide (ITO), indium zinc oxide (IZO), zinc oxide (ZnO), indium tin zinc oxide (ITZO), or the like. For example, the first electrode EL1 may have a three-layer structure of ITO/Ag/ITO, or a three-layer structure of Ag/ITO/Ag.

The hole transport region HTR may be provided on the first electrode EL1. The hole transport region HTR may be in a form of a single layer structure having a single layer composed of a single material, a single layer structure having a single layer composed of a plurality of different materials, or a multilayer structure having a plurality of layers composed of a plurality of different materials.

The hole transport region HTR may include at least one of a hole injection layer HIL, a hole transport layer HTL, a hole buffer layer, and an electron blocking layer EBL.

For example, the hole transport region HTR may have a single layer structure having a single layer of the hole injection layer HIL or the hole transport layer HTL, or have a single layer structure having a single layer formed of a hole injection material and a hole transport material. In some implementations, the hole transport region HTR may have a single layer structure having a single layer composed of a plurality of different materials, or have a structure of the hole injection layer HIL/the hole transport layer HTL, the hole injection layer HIL/the hole transport layer HTL/the hole buffer layer, the hole injection layer HIL/the hole buffer layer, the hole transport layer HTL/the hole buffer layer, or the hole injection layer HIL/the hole transport layer HTL/the electron blocking layer EBL, sequentially laminated on the first electrode ELL as examples.

The hole transport region HTR may be formed by a suitable method such as vacuum deposition, spin coating, casting, Langmuir-Blodgett (LB), inkjet printing, laser printing, or laser induced thermal imaging (LITI).

The hole injection layer HIL may include, for example, a phthalocyanine compound such as copper phthalocyanine; N,N-diphenyl-N,N-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris (N,N-diphenylamino)triphenylamine (TDATA), 4,4',4"-tris{N,-(2-naphthyl)-N-phenylamino}-triphenylamine (2-TNATA), Poly(3,4-ethylenedioxythiophene)/Poly(4-styrenesulfonate) (PEDOT/PSS), polyaniline/dodecylbenzenesulfonic acid (PANI/DBSA), polyaniline/camphor sulfonic acid (PANI/CSA), (polyaniline)/poly(4-styrenesulfonate) (PANI/PSS), N,N'-di(naphthalene-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate], dipyrazino[2,3-f: 2',3'-h] quinoxaline-2,3,6,7,10,11-hexacarbonitrile (HAT-CN), or the like.

The hole transport layer HIL may include, for example, a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di (naphthalene-1-yl)-N,N-diphenyl-benzidine (NPD), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), or the like.

The electron blocking layer EBL may include a suitable material in the art. The electron blocking layer EBL may include, for example, a carbazole-based derivative such as N-phenylcarbazole and polyvinylcarbazole, a fluorene-based derivative, a triphenylamine derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N-(3-tolyl)amino]-3, 3'-dimethylbiphenyl (HMTPD), or 1,3-bis(carbazole-9-yl) benzene (mCP). In addition, as described above, the electron blocking layer EBL may include a nitrogen-containing compound according to an embodiment.

The thickness of the hole transport region HTR may be about 100 Å to about 10000 Å, or for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include a charge generating material to improve conductivity in addition to the above-mentioned materials. The charge generating material may be uniformly or non-uniformly dispersed in the hole transport region HTR. The charge generating material may be, for example, a p-dopant. The p-dopant may be one of a quinone derivative, a metal oxide, or a compound containing a cyano group, as examples. For example, the p-dopant may include a quinone derivative such as tetracyanoquino dimethane (TCNQ) or 2,3,5,6-tetrafluoro-tetracyanoquinodimethane (F4-TCNQ), and a metal oxide such as a tungsten oxide and a molybdenum oxide.

The light emitting layer EML may be provided on the hole transport region HTR. The thickness of the light emitting layer EML may be, for example, about 100 Å to about 1,000 Å, or about 100 Å to about 300 Å. The light emitting layer EML may be in a form of a single layer structure having a single layer composed of a single material, a single layer structure having a single layer composed of a plurality of different materials, or a multilayer structure having a plurality of layers composed of a plurality of different materials.

The light emitting layer EML may include a blue, red, or green light emitting material. The light emitting layer EML may include a host and a dopant. As a material of the light emitting layer EML, a general light emitting material may be used. The material of the light emitting layer EML may be selected from a fluoranthene derivative, a pyrene derivative, an arylacetylene derivative, an anthracene derivative, a fluorene derivative, a perylene derivative, a chrysene derivative, and the like. For example, a pyrene derivative, a perylene derivative, and an anthracene derivative may be used.

The light emitting layer EML may include, for example, a fluorescent material including any one selected from the group consisting of spiro-DPVBi, 2,2',7,7'-tetrakis(biphenyl-4-yl)-9,9'-spirobifluorene (spiro-6P), distyryl-benzene (DSB), distyryl-arylene (DSA), a polyfluorene (PFO)-based polymer, and a poly(p-phenylene vinylene) (PPV)-based polymer.

As described above, the light emitting layer EML may include a dopant. As a red dopant, for example, a light emitting layer EML may include a fluorescent material including tris(dibenzoylmethanato)phenanthroline europium (PBD:Eu(DBM)$_3$(Phen)) or perylene. Dopants that may be included in the light emitting layer EML may be selected from, for example, a metal complex such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or an organometallic complex.

As a green dopant, for example, a light emitting layer EML may include a fluorescent material including tris(8-hydroxyquinolino)aluminum (Alq$_3$). Dopants that may be included in the light emitting layer EML may be selected from, for example, a metal complex such as fac-tris(2-phenylpyridine)iridium Ir(ppy)$_3$ or an organometallic complex.

As a blue dopant, for example, a light emitting layer EML may include a fluorescent material including any one selected from the group consisting of spiro-DPVBi, spiro-6P, distyryl-benzene (DSB), distyryl-arylene (DSA), a polyfluorene (PFO)-based polymer, and a poly(p-phenylene vinylene) (PPV)-based polymer. Dopants that may be included in the light emitting layer EML may be selected from, for example, a metal complex such as $(4,6-F_2ppy)_2$ Irpic or an organometallic complex.

The electron transport region ETR may be provided on the light emitting layer EML. The electron transport region ETR may be in a form of a single layer structure having a single layer composed of a single material, a single layer structure having a single layer composed of a plurality of different materials, or a multilayer structure having a plurality of layers composed of a plurality of different materials.

For example, the electron transport region ETR may be in a form of a single layer structure having a single layer of an electron injection layer EIL or an electron transport layer ETL, or a single layer structure having a single layer formed of an electron injection material and an electron transport material. In some implementations, the electron transport region ETR may be in a form of a single layer structure having a single layer formed of a plurality of different materials, or a structure of the electron transport layer ETL/the electron injection layer EIL, a hole blocking layer HBL/the electron transport layer ETL/the electron injection layer EIL, sequentially laminated on the first electrode EL1. The thickness of the electron transport region ETR may be, for example, about 100 Å to about 1500 Å.

The electron transport region ETR may be formed by a suitable method such as vacuum deposition, spin coating, casting, Langmuir-Blodgett (LB), inkjet printing, laser printing, and laser induced thermal imaging (LITI).

The electron transport region ETR may include only an inorganic material.

The electron transport region ETR may include the electron transport layer ETL, which is directly disposed on the light emitting layer EML. The electron transport layer ETL may contact the light emitting layer EML. The electron transport layer may include an inorganic material. The electron transport layer ETL may be a layer composed only of an inorganic material. The electron transport layer ETL may include a first ternary compound including a halogen element. The electron transport layer ETL may be composed of the first ternary compound including a halogen element.

The thickness of the electron transport layer ETL may be, for example, about 100 Å to about 1,500 Å, about 100 Å to about 1,000 Å, or about 150 Å to about 500 Å. When the thicknesses of the electron transport layers ETL satisfy the above-described ranges, satisfactory electron transport properties may be obtained without a substantial increase in driving voltage.

The first ternary compound may be represented by Formula 1 below.

   [Formula 1]

In Formula 1, X and Y may each independently be an alkali metal, an alkaline earth metal, or a lanthanide metal, Z may be a halogen element, and n, m, and q may each independently be an integer of 1 to 5.

In Formula 1, X and Y may each independently be a Group 1 element, a Group 2 element, a rare earth metal, a transition metal, or a post transition metal.

In Formula 1, n, m, and q may be appropriately selected depending on the choice of X, Y and Z elements, respectively.

The first ternary compound may include at least one of $KYbI_3$, $RbYbI_3$, $CsYbI_3$, $NaYbI_3$, $LiYbI_3$, $RbSmI_3$, $CsSmI_3$, $KSmI_3$, $NaSmI_3$, $LiSmI_3$, $RbMgI_3$, $CsMgI_3$, $KMgI_3$, $NaMgI_3$, or $LiMgI_3$. For example, the first ternary compound may be $KYbI_3$ or $RbYbI_3$.

A halide of an alkali metal, a halide of an alkaline earth metal, or a halide of a lanthanide metal may be optically transparent while having electron injection properties. However, a halide of an alkali metal, a halide of an alkaline earth metal, or a halide of a lanthanide metal is an insulator, thereby having low electrical conductivity such that it may be difficult to apply the same to an organic electroluminescence device except for an application in an extremely thin thickness. As a material of the electron transport layer ETL, the organic electroluminescence device OEL according to an embodiment may use a material obtained by doping an alkali metal, an alkaline earth metal, or a lanthanum metal with a halide of an alkali metal, a halide of an alkaline earth metal, or a halide of a lanthanide. A halide of an alkali metal, a halide of an alkaline earth metal, or a halide of a lanthanide metal reacts with an alkali metal, an alkaline earth metal, or a lanthanide metal to generate surplus electrons, thereby improving electrical properties. The first ternary compound formed by the reaction is also optically transparent.

The electron transport region ETR may further include the electron injection layer EIL. The electron injection layer EIL may be directly disposed on the electron transport layer ETL and may contact the second electrode EL2. The electron injection layer EIL may be composed of only an inorganic material.

The electron injection layer EIL may include the second ternary compound. The second ternary compound may be the same as or different from the first ternary compound. The second ternary compound may be represented by Formula 1 described above, as an example. For example, the electron injection layer EIL may include at least one of LiF, Lithium quinolate (Liq), $Li_2O$, BaO, NaCl, CsF, or a lanthanide metal The thickness of the electron injection layers EIL may be about 1 Å to about 100 Å, about 3 Å to about 90 Å, or about 10 Å to about 30 Å. When the thicknesses of the electron injection layers EIL satisfy the above-described ranges, satisfactory electron injection properties may be obtained without a substantial increase in driving voltage The second electrode EL2 may be provided on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be composed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). Also, the second electrode EL2 may be in a form of a multilayer structure including a reflective film or a transflective film, both composed of the above materials, and a transparent conductive film composed of indium tin oxide (ITO), indium zinc oxide (IZO), zinc oxide (ZnO), indium tin zinc oxide (ITZO), or the like.

The second electrode EL2 may be connected to an auxiliary electrode. When the second electrode EL2 is connected to the auxiliary electrode, the resistance of the second electrode EL2 may be reduced.

When the organic electroluminescence device OEL is a top emission type, the first electrode EL1 may be a reflective electrode, and the second electrode EL1 may be a transmissive electrode or a transflective electrode. When the organic electroluminescence device OEL is a bottom emission type, the first electrode EL1 may be a transmissive electrode or a transflective electrode, and the second electrode EL2 may be a reflective electrode.

In the case of a general organic luminescence device, an electron transport layer generally includes an organic material. When an electron transport layer includes an organic material, reliability may be reduced in a high temperature and high humidity environment. There is also a limitation in that costs of organic materials are high. The organic electroluminescence device OEL according to an embodiment may include the electron transport layer ETL including an inorganic material. Thus, the organic electroluminescence device OEL according to an embodiment may be capable of maintaining high reliability in a high temperature and high humidity environment, and may also be advantageous in terms of costs when compared with an electron transport layer ETL that includes an organic material. Also, an inorganic material may be applied to the first ternary compound. Accordingly, it is possible to realize effects of low driving voltage and high efficiency.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example 1

Example 1

An organic electroluminescence device according to Example 1 was formed as follows.

After a first electrode was formed of ITO, a hole injection layer and a hole transport layer were sequentially formed. Thereafter, a red light emitting layer was formed on the hole transport layer. On the red light emitting layer, Yb and RbI were co-deposited in a volume ratio of 9:1 to form an electron transport layer. On the electron transport layer, Ag and Mg were co-deposited in a volume ratio of 9:1 to form a second electrode. As materials of the hole injection layer, the hole transport layer, and the light emitting layer, suitable materials were used.

Example 2

An organic electroluminescence device was manufactured in the same manner as in Example 1 except that a green light emitting layer was formed instead of the red light emitting layer.

Example 3

An organic electroluminescence device was manufactured in the same manner as in Example 1 except that a blue light emitting layer was formed instead of the red light emitting layer.

Example 4

An organic electroluminescence device was manufactured in the same manner as in Example 1 except that Yb and RbI were co-deposited in a volume ratio of 1:9.

Example 5

An organic electroluminescence device was manufactured in the same manner as in Example 1 except that Yb and RbI were co-deposited in a volume ratio of 1:9, and except that a green light emitting layer was formed instead of the red light emitting layer.

Example 6

An organic electroluminescence device was manufactured in the same manner as in Example 1 except that Yb and RbI were co-deposited in a volume ratio of 1:9, and except that a blue light emitting layer was formed instead of the red light emitting layer.

Example 7

An organic electroluminescence device was manufactured in the same manner as in Example 1 except that Yb and KI were co-deposited in a volume ratio of 3:7.

Example 8

An organic electroluminescence device was manufactured in the same manner as in Example 1 except that Yb and KI were co-deposited in a volume ratio of 3:7, and except that a green light emitting layer was formed instead of the red light emitting layer.

Example 9

An organic electroluminescence device was manufactured in the same manner as in Example 1 except that Yb and KI were co-deposited in a volume ratio of 3:7, and except that a blue light emitting layer was formed instead of the red light emitting layer.

Example 10

An organic electroluminescence device was manufactured in the same manner as in Example 7 except that Yb and KI were co-deposited in a volume ratio of 1:9.

Example 11

An organic electroluminescence device was manufactured in the same manner as in Example 10 except that a green light emitting layer was formed instead of the red light emitting layer.

Example 12

An organic electroluminescence device was manufactured in the same manner as in Example 10 except that a blue light emitting layer was formed instead of the red light emitting layer.

Comparative Example 1

An organic electroluminescence device was manufactured in the same manner as in Example 1 except that an electron transport layer was formed of an organic material, Yb was deposited on the electron transport layer to form an electron injection layer, and then a second electrode was formed. As a material of the electron transport layer, a suitable organic compound was used.

Comparative Example 2

An organic electroluminescence device was manufactured in the same manner as in Comparative Example 1 except that a green light emitting layer was formed instead of the red light emitting layer.

Comparative Example 3

An organic electroluminescence device was manufactured in the same manner as in Comparative Example 1 except that a blue light emitting layer was formed instead of the red light emitting layer.

The light emitting efficiency of the organic electroluminescence devices according to Examples 1 to 12 and Comparative Examples 1 to 3 are shown in Table 1 below.

TABLE 1

|  | Light emitting efficiency (cd/A) |
| --- | --- |
| Example 1 (Red light emitting device) | 34.2 |
| Example 2 (Green light emitting device) | 57.5 |
| Example 3 (Blue light emitting device) | 104.0 |
| Example 4 (Red light emitting device) | 34.2 |
| Example 5 (Green light emitting device) | 57.5 |
| Example 6 (Blue light emitting device) | 102.5 |
| Example 7 (Red light emitting device) | 34.3 |
| Example 8 (Green light emitting device) | 58.0 |
| Example 9 (Blue light emitting device) | 104.0 |
| Example 10 (Red light emitting device) | 33.8 |
| Example 11 (Green light emitting device) | 56.8 |
| Example 12 (Blue light emitting device) | 102.1 |
| Comparative Example 1 (Red light emitting device) | 34.1 |
| Comparative Example 2 (Green light emitting device) | 54.5 |
| Comparative Example 3 (Blue light emitting device) | 102.0 |

Experimental Example 2

The light emitting efficiency and the driving voltage of a first white organic electroluminescence display device including Examples 1 to 3, a second white organic electroluminescence display device including Examples 4 to 6, a third white organic electroluminescence display device including Examples 7 to 9, a fourth white organic electroluminescence display device including Examples 10 to 12, and a fifth white organic electroluminescence display device including Comparative examples 1 to 3 are shown in Table 2 below.

TABLE 2

|  | Driving Voltage (V) | Light emitting efficiency (cd/A) |
| --- | --- | --- |
| First white organic electroluminescence display device | 2.5 | 30.7 |
| Second white organic electroluminescence display device | 3.00 | 30.5 |
| Third white organic electroluminescence display device | 2.33 | 30.8 |
| Fourth white organic electroluminescence display device | 2.94 | 30.2 |
| Fifth white organic electroluminescence display device | 3.62 | 29.8 |

From the results shown in Table 1 and Table 2, it can be seen that in the case in which an electron transport layer is composed of an inorganic material that is a first ternary compound, the light emitting efficiency is excellent and the driving voltage is low compared with the case in which the electron transport layer is composed of an organic material.

Hereinafter, referring to FIGS. 4 to 7, an organic electroluminescence display device according to an embodiment will be described. Hereinafter, differences from the organic electroluminescence device described above will be described in detail, and the undescribed parts are in accordance with the descriptions described above.

An organic electroluminescence display device DD according to an embodiment includes the above-described organic electroluminescence device (OEL of FIG. 1) according to an embodiment.

Figure 4:
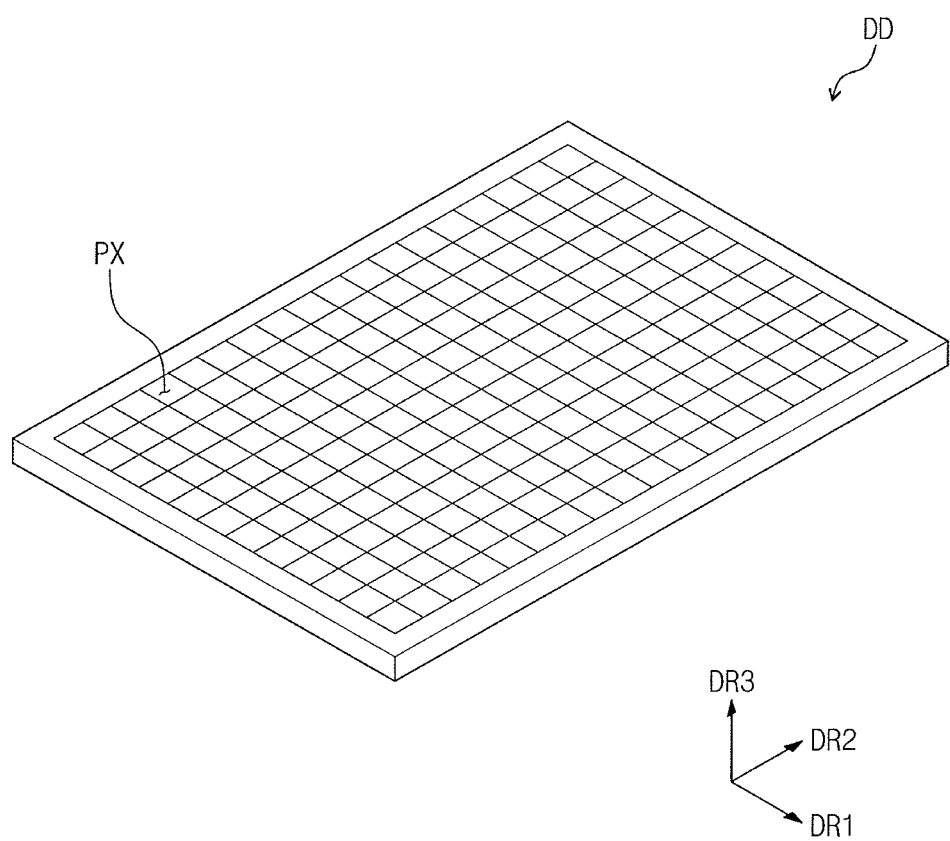
FIG. 4 illustrates a perspective view of an organic electroluminescence display device according to an embodiment.

FIG. 4 illustrates a perspective view of an organic electroluminescence display device according to an embodiment. The upper surface of each component is parallel to a plane defined by a first direction axis DR1 and a second direction axis DR2. The thickness direction of each component is indicated by a third direction axis DR3. The upper side (or upper portion) and the lower side (or lower portion) of each component are distinguished by the third direction axis DR3. However, the directions indicated by the first to third direction axes DR1 to DR3 are relative and may be converted to other directions. Hereinafter, a first to third directions are directions respectively indicated by the first to third direction axes DR1 to DR3 and refer to the same reference numerals thereof.

The organic electroluminescence display device DD according to an embodiment includes a plurality of pixels PX. The pixels PX may be arranged in a matrix form. Each of the pixels PX includes the above-described organic electroluminescence device OEL according to an embodiment. At least some of the pixels PX may generate light of different wavelength regions, respectively.

Figure 5:
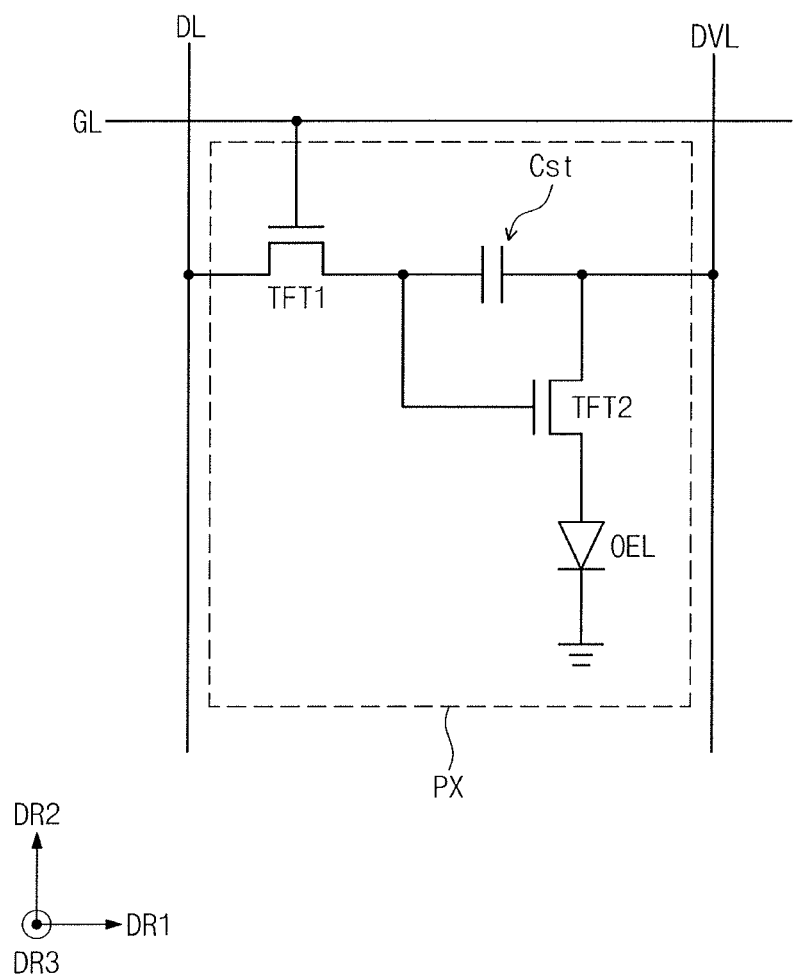
FIG. 5 illustrates a circuit diagram of one of the pixels included in an organic electroluminescence display device according to an embodiment.
Figure 6:
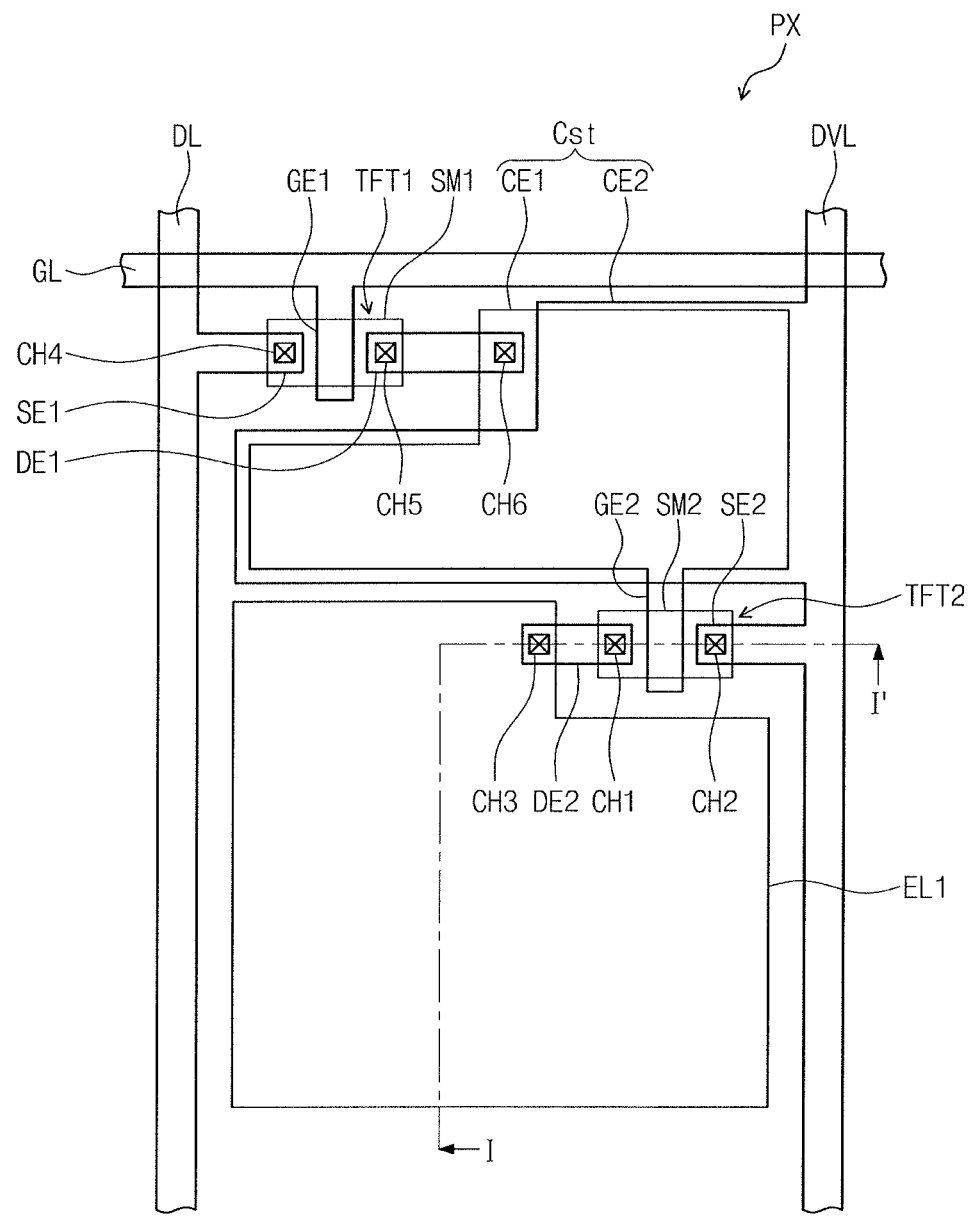
FIG. 6 illustrates a plan view showing one of the pixels included in an organic electroluminescence display device according to an embodiment.
Figure 7:
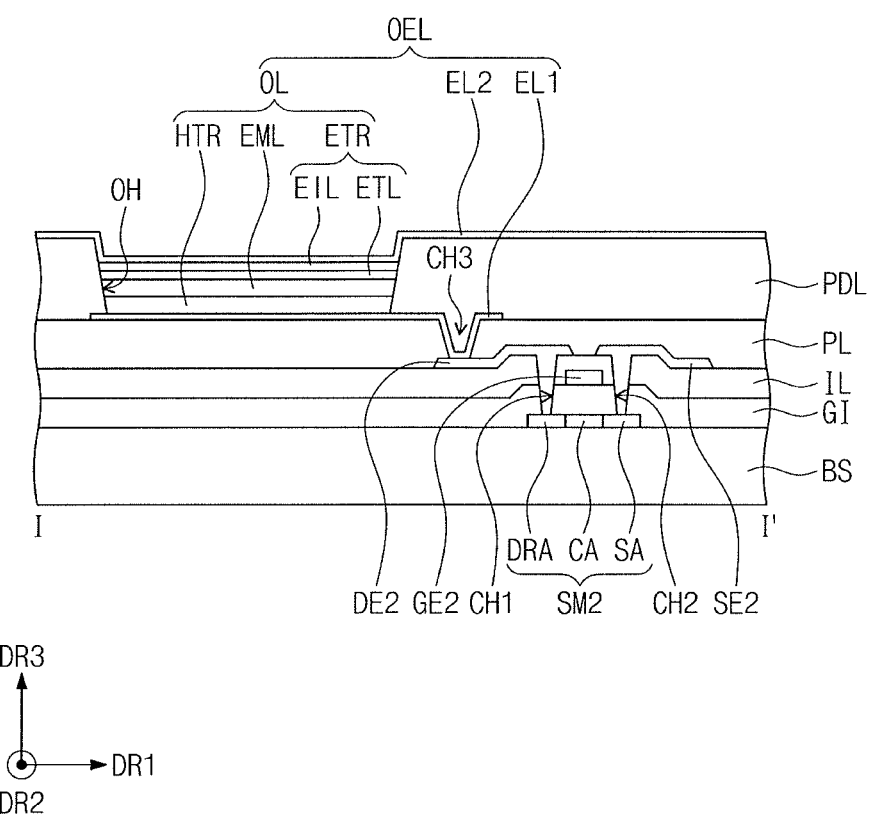
FIG. 7 illustrates a cross-sectional view taken along line I-I' of FIG. 6.

FIG. 5 illustrates a circuit diagram of one of the pixels included in an organic electroluminescence display device according to an embodiment. FIG. 6 illustrates a plan view showing one of the pixels included in an organic electroluminescence display device according to an embodiment. FIG. 7 illustrates a cross-sectional view taken along line I-I' of FIG. 6.

Referring to FIGS. 5 to 7, each of the pixels PX may be connected to a wiring portion composed of a gate line GL, a data line DL, and a driving voltage line DVL. The pixel PX may include thin film transistors TFT1 and TFT2 connected to the wiring portion, the organic electroluminescence device OEL connected to the thin film transistors TFT1 and TFT2, and a capacitor Cst.

The gate line GL may extend in the first direction DR1. The data line DL may extend in the second direction DR2 crossing the gate line GL. The driving voltage line DVL may extend in substantially the same direction as the data line DL, that is, the second direction DR2. The gate line GL transmits a scanning signal to the thin film transistors TFT1 and TFT2. The data line DL may transmit a data signal to the thin film transistors TFT1 and TFT2. The driving voltage line DVL may provide driving voltage to the thin film transistors TFT1 and TFT2.

The thin film transistors TFT1 and TFT2 may include a driving thin film transistor TFT2 that controls the organic electroluminescence device OEL, and a switching thin film transistor TFT1 that switches the driving thin film transistor TFT2. In an embodiment, the pixel PX including two thin film transistors TFT1 and TFT2 is described. In some implementations, the pixel PX may include one thin film transistor and a capacitor, or the pixel PX may include three or more thin film transistors and two or more capacitors.

The switching thin film transistor TFT1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 through a fifth contact hole CH5. The switching thin film transistor TFT1 may deliver a data signal applied to the data line DL to the driving thin film transistor TFT2 according to a scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE2 may be connected to the driving voltage line DVL. The second drain electrode DE2 may be connected to the first electrode EL1 through a third contact hole CH3.

The capacitor Cst may be connected between the second gate electrode GE2 of the driving thin film transistor TFT2 and the second source electrode SE2 of the driving thin film transistor TFT2. The capacitor Cst may charge and maintain a data signal inputted to the second gate electrode GE2 of the driving thin film transistor TFT2. The capacitor Cst may include the first common electrode CE1 connected to the first drain electrode DE1 through a sixth contact hole CH6, and a second common electrode CE2 connected to the driving voltage line DVL.

The organic electroluminescence display device DD according to an embodiment may include a base substrate BS on which the thin film transistors TFT1 and TFT2 and the organic electroluminescence device OEL are laminated. The base substrate BS may be formed of, for example, an insulating material such as glass, plastic, and quartz. An organic polymer forming the base substrate BS may include polyethylene terephthalate (PET), polyethylene naphthalate (PEN), polyimide, polyether sulfone, or the like. The base substrate BS may be selected in consideration of the mechanical strength, thermal stability, transparency, surface smoothness, ease of handling, water resistance, or the like thereof.

A substrate buffer layer may be disposed on the base substrate BS. The substrate buffer layer may prevent impurities from diffusing into the switching thin film transistor TFT1 and the driving thin film transistor TFT2. The substrate buffer layer may be formed of silicon nitride (SiNx), silicon oxide (SiOx), silicon oxynitride (SiOxNy), or the like, and may be omitted according to the material and processing conditions of the base substrate BS.

A first semiconductor layer SM1 and a second semiconductor layer SM2 may be disposed on the base substrate BS.

The first semiconductor layer SM1 and the second semiconductor layer SM2 may be formed of a semiconductor material, and may respectively act as an active layer for the switching thin film transistor TFT1 and the driving thin film transistor TFT2. The first semiconductor layer SM1 and the second semiconductor layer SM2 may respectively include a source area SA, a drain area DRA, and a channel area CA, which is disposed between the source area SA and the drain area DRA. The first semiconductor layer SM1 and the second semiconductor layer SM2 may be respectively selected from and formed of an inorganic semiconductor or an organic semiconductor. The source area SA and the drain area DRA may be doped with an n-type impurity or a p-type impurity.

A gate insulating layer GI may be disposed on the first semiconductor layer SM1 and the second semiconductor layer SM2. The gate insulating layer GI may cover the first semiconductor layer SM1 and the second semiconductor layer SM1. The gate insulating layer GI may be formed of an organic insulating material or an inorganic insulating material.

The first gate electrode GE1 and the second gate electrode GE2 may be disposed on the gate insulating layer GI. The first gate electrode GE1 and the second gate electrode GE2 may be provided to cover areas each corresponding to the channel area CA of the first semiconductor layer SM1 and the channel area CA of the second semiconductor layer SM2.

An interlayer insulating layer IL may be disposed on the first gate electrode GE1 and the second gate electrode GE2. The interlayer insulating layer IL may cover the first gate electrode GE1 and the second gate electrode GE2. The interlayer insulating layer IL may be formed of an organic insulating material or an inorganic insulating material.

The first source electrode SE1, the first drain electrode DE1, the second source electrode SE2, and the second drain electrode DE2 may be disposed on the interlayer insulating layer IL. The second drain electrode DE2 may contact the drain area DRA of the second semiconductor layer SM2 through a first contact hole CH1 formed on the gate insulating layer GI and the interlayer insulating layer IL. The second source electrode SE2 may contact the source area SA of the second semiconductor SM2 through a second contact hole CH2 formed on the gate insulating layer GI and an interlayer insulating layer IL. The first source electrode SE1 may contact a source area of the first semiconductor layer SM1 through a fourth contact hole CH4 formed on the gate insulating layer GI and the interlayer insulating layer IL. The first drain electrode DE1 may contact a drain area of the first semiconductor layer SM1 through the fifth contact hole CH5 formed on the gate layer GI and the interlayer insulating layer IL.

The first drain electrode DE1, the second source electrode SE2, and the second drain electrode DE2, a passivation layer PL may be disposed on the first source electrode SE1. The passivation layer PL may serve as a protection layer for protecting the switching thin film transistor TFT1 and the driving thin film transistor TFT2, or as a planarization layer for planarizing the upper surfaces thereof.

The above-described organic electroluminescence device OEL according to an embodiment may be disposed on the passivation layer PL. The organic electroluminescence device OEL may include the first electrode EL1, the second electrode EL2 disposed on the first electrode EL1, and an organic layer OL disposed between the first electrode EL1 and the second electrode EL2. The organic layer OL may include the hole transport region HTR, the light emitting layer EML, and the electron transport region ETR. The electron transport region ETR may be directly disposed on the light emitting layer EML The electron transport region ETR may include the electron transport layer ETL including the first ternary compound, and may further include the electron injection layer EIL disposed on the electron transport layer ETL as desired. The detailed description of the organic electroluminescence device OEL may be the same as described above.

The first electrode EL1 may be provided on the passivation layer PL, and a pixel defining layer PDL may be disposed on the passivation layer PL and the first electrode EL1. An opening OH that exposes at least a portion of the upper surface of the first electrode EL1 may be defined on the pixel defining layer PDL. The pixel defining layer PDL may be configured to partition the organic electroluminescence device OEL so as to correspond to each of the pixels PX.

The pixel defining layer PDL may be formed of a polymer resin. For example, the pixel defining layer PDL may be formed by including a polyacrylate-based resin, or a polyimide-based resin. In some implementations, the pixel defining layer PDL may be formed by further including an inorganic material in addition to a polymer resin. The pixel defining layer PDL may be formed by including a light absorbing material, or may be formed by including a black pigment or a black dye. The pixel defining layer PDL formed by including a black pigment or a black dye may provide a black pixel defining layer. When forming the pixel defining layer PDL, carbon black or the like, as example, may be used as a black pigment or a black dye.

In some implementations, the pixel defining layer PDL may be composed of an inorganic material. For example, the pixel defining layer PDL may include SiNx, SiOx, SiOxNy, or the like.

The organic electroluminescence display device DD according to an embodiment may be capable of maintaining high reliability even in a high temperature and high humidity environment, and may be capable of realizing high efficiency even at low driving voltage. In addition, by applying an inorganic material to the electron transport layer ETL, costs may be reduced compared with using an organic material.

Hereinafter, a method for manufacturing an organic electroluminescence display device described above will be described with reference to FIG. 8.

Figure 8:
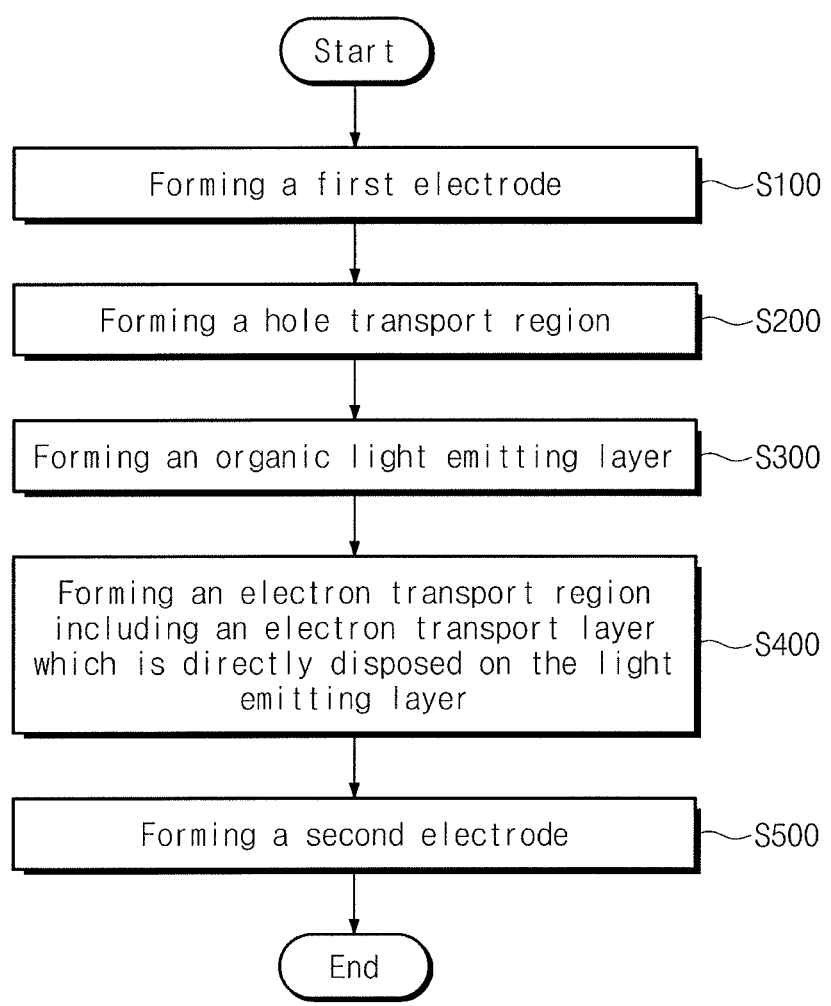
FIG. 8 illustrates a schematic flowchart of a method for manufacturing an organic electroluminescence display device according to an embodiment.

FIG. 8 illustrates a schematic flowchart of stages of a method for manufacturing an organic electroluminescence display device according to an embodiment. Herein, S100, S200, etc., refer to respective stages as illustrated in FIG. 8.

Referring to FIGS. 1 to 8, a method for manufacturing an organic electroluminescence display device according to an embodiment includes forming the first electrode EL1 (S100), forming the hole transport region HTR on the first electrode EL1 (S200), forming the light emitting layer EML on the hole transport region HTR (S300), forming the electron transport region ETR on the light emitting layer EML (S400), and forming the second electrode EL2 on the electron transport region ETR (S500).

Forming the first electrode EL1 (S100), forming the hole transport region HTR (S200), forming the light emitting layer EML (S300), and forming the second electrode EL2 (S500) may each be performed by a suitable method. For example, each step may be performed by vacuum deposition, or by spin coating, casting, Langmuir-Blodgett (LB), inkjet printing, laser printing, or laser induced thermal imaging (LITI).

Forming the electron transport region ETR on the light emitting layer EML (S400) may include forming the electron transport layer ETL, which is directly disposed on the light emitting layer EML. For example, forming the electron transport region ETR may include forming the electron transport layer ETL directly on the light emitting layer EML. As a result, the electron transport layer ETL may contact the light emitting layer EML.

Forming the electron transport layer ETL may be performed by co-depositing a first component and a second component. By co-depositing a first component and a second component, the ternary compound is produced.

In some implementations, forming the electron transport layer ETL may be performed by mixing the first component and the second component, and then applying the mixture on the light emitting layer EML. For example, forming the electron transport layer ETL may be performed by mixing the first component and the second component in a crucible, heating the mixture to form a ternary compound, and then subjecting the mixture to thermal evaporation and deposition.

The first component may be a halide of any one of an alkali metal, an alkaline earth metal, or a lanthanide metal. The second component may be any one of an alkali metal, and alkaline earth metal, or a lanthanide metal The first component may be potassium iodide (KI), potassium chloride (KCl), lithium chloride (LiCl), sodium chloride (NaCl), rubidium chloride (RbCl), cesium chloride (CsCl), potassium bromide (KBr), rubidium bromide (RbBr), cesium bromide (CsBr), rubidium iodide (RbI), sodium iodide (NaI), lithium iodide (LiI) or cesium iodide (CsI).

The second component may be ytterbium (Yb), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu), beryllium (Be), magnesium (Mg), calcium (Ca), strontium (Sr), barium (Ba), or radium (Ra).

Forming the electron transport layer ETL may include co-depositing the first component and the second component in a volume ratio of 1:9 to 9:1, or, for example, 4:6 to 6:4. For example, forming the electron transport layer ETL may include co-depositing RbI and Yb. As another example, forming the electron transport layer ETL may include co-depositing KI and Yb.

Forming the electron transport region ETR (S400) may further include forming the electron injection layer EIL after forming the electron transport layer ETL. Forming the electron injection layer EIL may include depositing an inorganic material directly on the electron transport layer ETL. Subsequently forming the second electrode EL2 (S500) may include forming the second electrode EL2 directly on the electron injection layer EIL. Forming the second electrode EL2 (S500) may include, for example, co-depositing Ag and Mg.

Forming the electron injection layer EIL may be performed by co-depositing the first component and the second component described above. At this time, the volume ratio of the first component to the second component may be either the same as or different from that used in forming the electron transport layer ETL.

As another example, forming the electron injection layer EIL may include co-depositing at least one of LiF, lithium quinolate (Liq), $Li_2O$, BaO, NaCl, CsF, or a lanthanide metal.

By way of summation and review, as an organic electroluminescence device, for example, an organic device may be composed of a first electrode, a hole transport layer disposed on the first electrode, a light emitting layer disposed on the hole transport layer, an electron transport layer disposed on the light emitting layer, and a second electrode disposed on the electron transport layer. From the first electrode, a hole is injected, and the injected hole moves through the hole transport layer to be injected to the light emitting layer. From the second electrode, an electron is injected, and the injected electron moves through the electron transport layer to be injected to the light emitting layer. The hole and the electron both injected to the light emitting layer are recombined to generate an exciton in the light emitting layer. An organic electroluminescence device emits light using light generated when the exciton falls to a ground state again.

The method for manufacturing an organic electroluminescence device according to an embodiment includes forming an electron transport layer with an inorganic material, thereby providing an organic electroluminescence device capable of maintaining high reliability in a high temperature and high humidity environment, a method for manufacturing the same, and a display device including the same.

An organic electroluminescence device according to an embodiment provides an organic electroluminescence device having excellent process economics, a method for manufacturing the same, and a display device including the same, thereby providing a method of manufacturing an organic electroluminescence device of high efficiency at relatively low costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic electroluminescence device, comprising:
a first electrode;
a hole transport region on the first electrode;
a light emitting layer on the hole transport region;
an electron transport region on the light emitting layer; and
a second electrode on the electron transport region, wherein
the electron transport region includes an electron transport layer directly on the light emitting layer, and
an electron injection layer on the electron transport layer and contacting the second electrode,
wherein the electron transport layer includes a first ternary compound including a halogen element,
wherein the electron injection layer includes a second ternary compound,
wherein the first ternary compound and the second ternary compound are each independently represented by Formula 1 below:

$$X_n Y_m Z_q \qquad \text{[Formula 1]}$$

in Formula 1, X is an alkali metal, or an alkaline earth metal, Y is a lanthanide metal; Z is the halogen element; and n, m, and q are each independently an integer of 1 to 5,
wherein in the first ternary compound, X is an alkaline earth metal.

2. The organic electroluminescence device as claimed in claim 1, wherein the electron injection layer is directly on the electron transport layer and contacting the second electrode.

3. The organic electroluminescence device as claimed in claim 2, wherein the first ternary compound and the second ternary compound are the same or different.

4. An organic electroluminescence display device, comprising:
a base substrate;
a thin film transistor on the base substrate; and
an organic electroluminescence device connected to the thin film transistor, wherein the organic electroluminescence device includes:
a first electrode;
a hole transport region on the first electrode;
a light emitting layer on the hole transport region;
an electron transport region on the light emitting layer; and
a second electrode on the electron transport region, wherein
the electron transport region includes an electron transport layer directly on the light emitting layer, and
an electron injection layer on the electron transport layer and contacting the second electrode,
wherein the electron transport layer includes a first ternary compound including a halogen element,
wherein the electron injection layer includes a second ternary compound,
wherein the first ternary compound and the second ternary compound are each independently represented by Formula 1 below:

$$X_n Y_m Z_q \qquad \text{[Formula 1]}$$

in Formula 1, X is an alkali metal, or an alkaline earth metal, Y is a lanthanide metal; Z is the halogen element; and n, m, and q are each independently an integer of 1 to 5,
wherein in the first ternary compound, X is an alkaline earth metal.

5. The organic electroluminescence display device as claimed in claim 4, wherein the electron injection layer is directly on the electron transport layer and contacting the second electrode.

6. The organic electroluminescence display device as claimed in claim 5, wherein the first ternary compound and the second ternary compound are the same.

7. The organic electroluminescence display device as claimed in claim 5, wherein the first ternary compound and the second ternary compound are different.

8. The organic electroluminescence device as claimed in claim 1, wherein the electron transport region is composed of only an inorganic material.

9. The organic electroluminescence display device as claimed in claim 4, wherein the electron transport region is composed of only an inorganic material.

* * * * *